United States Patent [19]

Fling

[11] Patent Number: 4,710,892
[45] Date of Patent: Dec. 1, 1987

[54] PHASE CALCULATION CIRCUITRY IN DIGITAL TELEVISION RECEIVER

[75] Inventor: Russell T. Fling, Noblesville, Ind.

[73] Assignee: RCA Corporation, Princeton, N.J.

[21] Appl. No.: 666,020

[22] Filed: Oct. 29, 1984

[51] Int. Cl.[4] .................... G06F 7/347; G06F 7/556; H04N 9/64

[52] U.S. Cl. .................................. 364/729; 364/715; 358/28

[58] Field of Search ............... 364/729, 730, 715, 817, 364/818; 358/28; 342/152

[56] References Cited

U.S. PATENT DOCUMENTS

| | | | |
|---|---|---|---|
| 3,956,623 | 5/1976 | Clark et al. ......................... | 364/729 |
| 4,164,022 | 8/1979 | Rattingound et al. ............... | 364/729 |
| 4,402,005 | 8/1983 | Lewis, Jr. ........................... | 358/28 |
| 4,523,221 | 6/1985 | Chin et al. .......................... | 358/28 |
| 4,528,586 | 7/1985 | Lewis, Jr. et al. .................... | 358/28 |
| 4,544,944 | 10/1985 | Chin .................................... | 358/28 |
| 4,558,351 | 12/1985 | Fling et al. ........................... | 358/28 |
| 4,562,460 | 12/1985 | Harwood ............................. | 358/28 |

Primary Examiner—Gary V. Harkcom
Assistant Examiner—Dale M. Shaw
Attorney, Agent, or Firm—Paul J. Rasmussen; Eric P. Herrmann; Dilip A. Kulkarni

[57] ABSTRACT

An angle $\alpha$ from 0° to 45° is determined from an equation $\alpha° = LK\iota(\tan \alpha)^\iota$, where $\iota$ is an index varying from 0 to n. The value of $\tan \alpha$ is arrived at by dividing the smaller of the I,Q magnitude values by the larger of the two magnitude values. The angle $\alpha$ from 0° to 45° is transposed to the corresponding phase angle $\theta$ of the vector sum C of the orthogonal I,Q signals over the full range of values from 0° to 360°.

4 Claims, 7 Drawing Figures

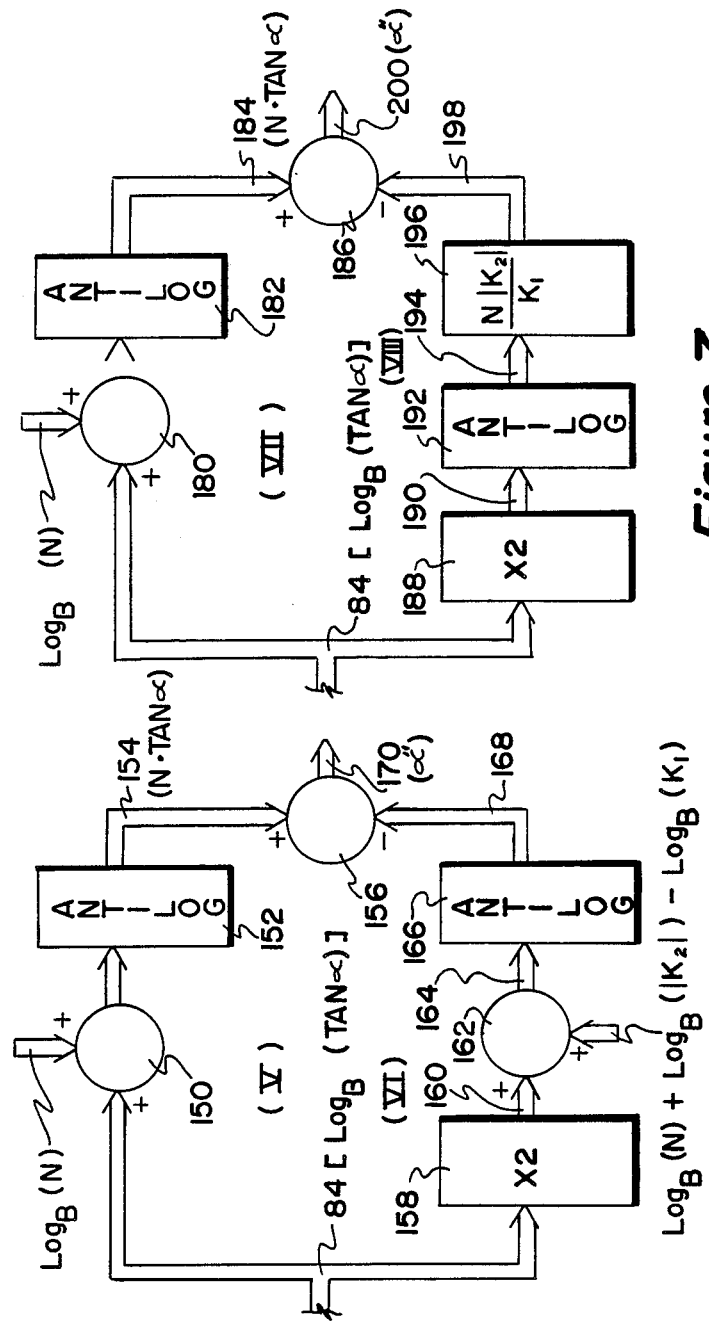

PHASE CALCULATION CIRCUITRY IN DIGITAL TELEVISION RECEIVER

The present invention relates to circuitry for calculating the value of the phase of the vector sum of two orthogonally-related component signals. More particularly, it is directed toward reducing the circuitry needed to perform the required arctangent calculations. The invention has general applicability, but is particularly useful in digital television receivers where it is desired to perform digital video signal processing with a minimum of hardware.

BACKGROUND OF THE INVENTION

In many electronic systems, it is necessary to determine the phase of the vector sum of a pair of orthogonal signals with respect to one of its components. For example, in digital TV receivers, it is convenient to perform automatic flesh color correction by manipulating the phase and magnitude of the chrominance vector. The chrominance signal, is usually available in the form of two quadrature signals represented by the I and Q color mixture signals or the (R-Y) and (B-Y) color difference signals. Thus, to perform the required manipulation, the phase of the chrominance vector must be determined from its perpendicularly-disposed component parts.

It is well known that the instantaneous phase of the vector sum of a pair of orthogonal signals may be ascertained by generating the arctangent of the ratio of the instantaneous magnitude values of the respective signal components —i.e., $\theta =$ Arctangent (Q/I). Typically, this is accomplished by using a read-only memory (ROM) to which $\tan \theta$ (i.e., Q/I) values are applied as address codes, and which is programmed to contain the associated $\theta$ values at the respective memory locations.

SUMMARY OF THE INVENTION

The vector sum phase calculating circuitry, in accordance with the present invention, generates sample values representing tangents of angles $\alpha$ over the range of zero to forty-five degrees by dividing the magnitude of the smaller of the first and second quadrature signals I and Q by the magnitude of the larger of the two signals. The tangent values are converted to corresponding angle-related values by using an equation $\alpha = \Sigma K_\iota (\tan \alpha)_\iota$, where $\iota$ is an index varying from zero to n. The constants $K_\iota$ can be determined, for example, by using the multiple regression technique.

Pursuant to a further feature of the invention, the angle-related values of $\alpha$ are transposed to the corresponding angle values $\theta$ representing the instantaneous phase of the chrominance vector C with respect to one of the two orthogonal component signals I and Q.

BRIEF DESCRIPTION OF THE DRAWINGS

FIGS. 6 and 7 illustrate block diagrams of alternate circuit arrangements for generating a value proportional to the angle $\alpha$ and suitable for use with the FIG. 2 phase angle $\theta$ generating circuitry.

DESCRIPTION OF THE PREFERRED EMBODIMENTS

Figure 1:
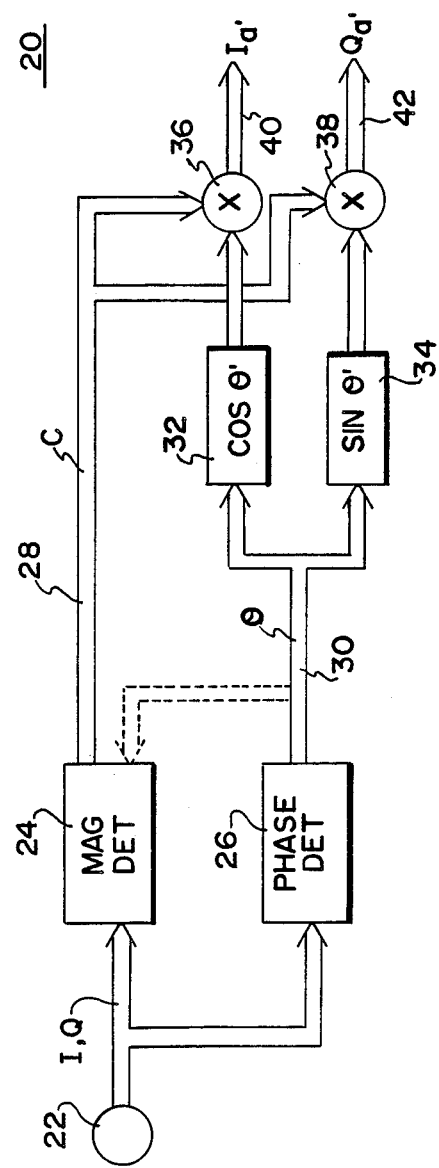
FIG. 1 is a block diagram of exemplary prior art circuitry for performing auto-flesh correction in a digital television receiver.

The circuitry 20 of FIG. 1 exemplifies an apparatus for performing auto-flesh correction in a digital television receiver. The auto-flesh correction circuitry 20 is located in the color signal processing section of the receiver and operates upon the quadrature-related color component vectors I and Q of the chrominance signal C after separation thereof from the composite video signal. The presumption is made that the chrominance signal samples C occur at 4 times the color subcarrier rate (e.g., 3.58 MHz), and that the samples are phased to correspond with the I and Q axes. This results in a stream of I and Q sample values in a certain sequence: $+I_n, +Q_n, -I_n, -Q_n, +I_{n+1}, +Q_{n+1}, -I_{n+1}, -Q_{n+1}$ and so on, where n, n+1, etc., represent the cycle numbers of the sampled chrominance signal C and the + and − signs represent sampling phase, and not the sample polarity. It is further assumed that the sample values are in the digital format (e.g., 8-bit parallel PCM signals). A detailed description of a circuit of this type may be found in a copending U.S. patent application, Ser. No. 501,896, and entitled "AN AUTO TINT CIRCUIT FOR A TV RECEIVER" incorporated herein by reference. Reference may be also made to U.S. Pat. No. 4,402,005, issued to Lewis, Jr., and entitled "CLOCK GENERATOR FOR A DIGITAL COLOR TELEVISION SIGNAL RECEIVER", for a description of an illustrative circuit for generating a suitable stream of I and Q amplitude values.

Briefly the FIG. 1 circuit 20 operates as follows. Auto-flesh correction is performed by rotating the chrominance vector C toward the I component vector whenever the phase angle of the chrominance vector is within a particular range of values associated with flesh colors. The chrominance vector C, however, is represented by its component parts in the form of the orthogonal color mixture signal vectors I and Q or alternatively, by the orthogonal color difference signals (R-Y) and (B-Y). For descriptive purposes, the invention will be explained using the I and Q component signals. The circuit 20 outputs a rotated chrominance signal represented by substantially orthogonal color mixture signals I' and Q' corresponding to the rotated chrominance vector C'.

The I and Q signal sample stream is applied to terminal 22 from which it is routed to a magnitude detector 24 and an angle detector 26. The magnitude detector 22 generates a magnitude value of the vector sum C of the orthogonal I and Q signal components e.g., $C = \sqrt{I^2 + Q^2}$ and produces this signal on bus 28. The angle detector 26, in accordance with the present invention, produces a signal on bus 30 representing the angle $\theta$ corresponding to the angle between the chrominance vector C and the I sampling axis. The angle signal $\theta$ is applied as address codes to ROM's 32 and 34 which produce respectively, the sine and cosine values of the arguments corresponding to the address codes applied to their address inputs. For angles $\theta$, which do not reside within the range of angles ascribed to flesh tones, the ROM's are programmed to output the sines and cosines of the applied angle values. For angles $\theta$, which are within the range of angles associated with flesh tones, the ROM's produce sines and cosines of angles corresponding to $\theta + \Delta\theta$ where $\Delta\theta$ represents the desired rotation and is a function of $\theta$.

The cosine and sine values are respectively applied to multipliers 36 and 38 wherein they are multiplied by the magnitude values C generating the flesh-corrected component vectors $I' = C \cos \theta'$ and $Q' = C \sin \theta'$ on the buses 40 and 42.

Figure 2:
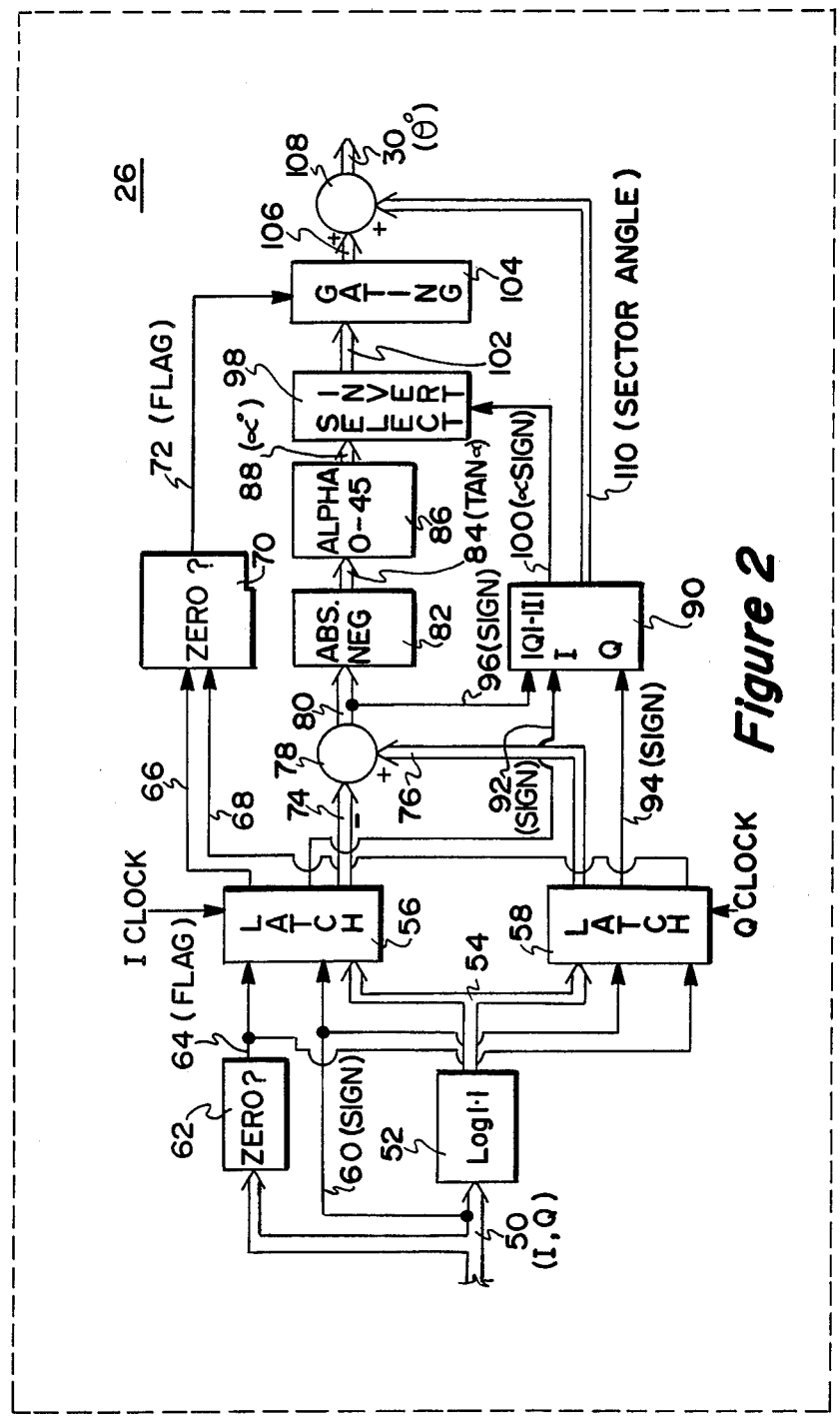
FIG. 2 depicts a block diagram of circuitry for generating the phase $\theta$ of the vector sum C of mutually perpendicular vectors I and Q embodying the present invention.

FIG. 2 illustrates the circuitry embodying the present invention, which may be substituted for the phase detector 26 of FIG. 1. Basically, the FIG. 2 circuitry 26 generates the tangent values of angles varying from zero to forty-five degrees by dividing the magnitudes of the smaller of the orthogonal I and Q signals by the magnitudes of the larger of the two orthogonal signals, and then transposes these angle values between 0° to 45° into the associated instantaneous phase angles of the chrominance vector C over the full range from 0° to 360°.

To this end, the signal sample sequence comprising I and Q sample values present at the terminal 22 is applied via an input bus 50 to the element 52, which produces the logarithmic values $\text{Log}_B|I|$ and $\text{Log}_B|Q|$ to the base B on the output bus 54. The element 52 may include a ROM having an input port to which the I and Q sample values are applied as address codes. The memory locations corresponding to the respective address codes may be programmed to provide the associated logarithmic values at the output port of the ROM 52. The use of a ROM for determining logarithmic values eliminates the necessity of real time calculations.

The base B to which logarithms are taken is selected to obtain high accuracy by maximizing the use of the available bits of the digital logarithms. Specifically, for a system arranged to process N-bit logarithmic values corresponding to M-bit signal samples including a sign bit, the logarithmic base B is equal to $$\text{Antiln}\left(\frac{\text{Ln}(2^{M-1} - 1)}{2^N - 1}\right),$$

where Ln designates the Naperian logarithm.

The $\text{Log}_B|I|$ and $\text{Log}_B|Q|$ values on the bus 54 are temporarily stored in the respective latches 56 and 58, along with the associated sign bits present on the link 60, in response to the appropriate I and Q clock signals.

The I and Q samples on the bus 50 are also fed to an element 62, which generates a zero-value flag (e.g., 1) on the output connection 64 whenever either I or Q samples assume a value equal to zero. The latches 56 and 58 additionally store the zero-value flags in response to the respective I and Q clock signals. The zero-value flags, available on the output links 66 and 68 of the respective latches 56 and 58, are applied to an element 70, which, in turn, produces another zero-value flag (e.g., 1) on its output connection 72, any time either I or Q sample value is zero. The zero-value flag on the output connection 72 is used to set the calculated value of the angles $\alpha$ equal to zero in the manner indicated later.

The $\text{Log}_B|I|$ and $\text{Log}_B|Q|$ values, present on the respective buses 74 and 76, are fed to a subtracter 78, which generates a value equal to $\text{Log}_B|Q| - \text{Log}_B|I|$ on the output bus 80. An element 82, coupled to the subtracter 78, produces on its output bus 84 the absolute negative value corresponding to the associated input value. The absolute negative value determining element 82 may, in turn, consist of a device that determines the absolute positive value followed by a device that determines a 2's complement. This arrangement produces on the bus 84 a value equal to the logarithm of the smaller of the I,Q magnitude values minus the logarithm of the larger of the two magnitude values, without actually having to determine which of the two sample values is larger and vice versa. The value on the bus 84 corresponds to the logarithm of a quotient obtained by dividing the smaller of the I,Q magnitude values by the larger of the two magnitude values.

Alternatively, it is possible to replace the subtracter 78 and the absolute negative value determining element 82 with a device for determining the larger and the smaller of the respective $\text{Log}_B|I|$ and $\text{Log}_B|Q|$ magnitude values, and a subtracter for subtracting the larger logarithmic sample value from the smaller logarithmic sample value. Reference may be made to U.S. patent application, Ser. No. 554,083, of Fling et al., and entitled "A HUE CORRECTION CIRCUIT FOR A DIGITAL TV RECEIVER" for an illustration of the alternative arrangement of the aforesaid type.

The value on the bus 84 representative of the logarithm of the quotient formed by dividing the smaller of the I and Q magnitude values by the larger of the two values is fed to an element 86, which produces an angle $\alpha$ equal to the arctangent of the respective quotient, over a 0° to 45° range, on the output bus 88 in the manner explained subsequently.

Figures 3, 4:
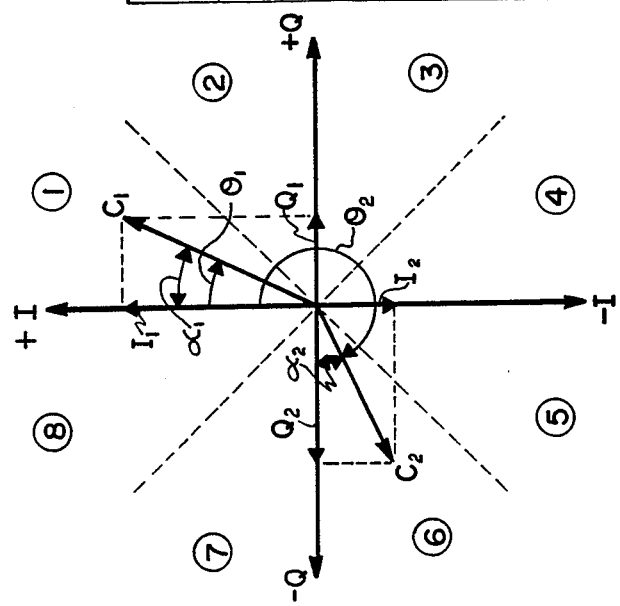
FIGS. 3 and 4 are a phasor diagram and a table of logic values describing the relationship between the phase $\theta$ of the chrominance vector C and the angle $\alpha$ varying between 0° and 45°, which corresponds to the quotient formed by dividing the smaller of the I,Q magnitude values by the larger of the two values.

The relationship between the angle $\alpha$ in degrees calculated by the element 86 and the phase $\theta$ of the vector sum C of the mutually perpendicular component signals I and Q will now be explained in conjunction with FIGS. 3 and 4. FIG. 3 is a phasor diagram showing the axes of the I and Q chrominance signal components and an instantaneous chrominance vector C. The intersection of the I and Q axes form four 90 degree quadrants, with the zero angular reference being along the positive I axis. The phase angle $\theta$ of the chrominance vector C is measured from the positive I axis in the clockwise direction, as indicated in FIG. 3, for the purpose of the description of the preferred embodiments. The four quadrants are divided into eight sectors 1–8 each of which encompasses a 45 degree sector.

The angle $\alpha$ is defined herein as the angle subtended by the chrominance vector C with the axis representing the larger of the two I and Q magnitude values. Putting it differently, $$\tan \alpha = \frac{\text{Smaller of the } |I| \text{ and } |Q| \text{ values}}{\text{Larger of the } |I| \text{ and } |Q| \text{ values}} \qquad (1)$$

In the first section, both $I_1$ and $Q_1$ are positive, and $I_1 > Q_1$ (i.e., $|Q_1| - |I_1|$ is negative). In this sector, $\theta°_1 = \alpha°_1$ or $\theta°_1 = 0° + \alpha°_1$. The sector angle, defined as the angle with which the $\alpha°$ value is combined to arrive at the phase angle $\theta°$, is zero degrees. The sign of the angle $\alpha°$ in the equation defining the relationship between $\theta°$ and $\alpha°$ is positive. FIG. 4 sets forth the sectors, the various signs, the $\theta/\alpha$ equations, the sector angles and the signs of $\alpha$ in the $\theta/\alpha$ equations.

When the chrominance vector or phasor C moves into the sector 6, both $I_2$ and $Q_2$ become negative and $|Q_2| > |I_2|$ or $|Q_2| - |I_2|$ is positive. The relationship between $\theta°_2$ and $\alpha°_2$ is $\theta°_2 = 27° - \alpha°_2$. From this equation, it is seen that the sector angle is 270° and the sign of $\alpha°_2$ is negative. Other relations indicated in FIG. 4 can be derived in a similar fashion.

Referring again to FIG. 2, a control element 90 generates the signs of the angle $\alpha$ and the associated sector angles, in accordance with the table set forth in FIG. 4, in response to the signs of I,Q and $\text{Log}_B|Q| - \text{Log}_B|I|$ sample values on the respective lines 92, 94 and 96. Circuit 90 may be a lookup ROM, which is addressed by the sign signals. An inverter 98 selectively inverts the value of $\alpha°$ in response to the control signal on the bus 100 representing the sign of the angle $\alpha°$ in the $\theta/\alpha$ equation. The value of the angle $\alpha°$ on the bus 102 is passed through a gating circuit 104 to a summing circuit 108, where it is combined with the sector angle on the bus 110 to generate the phase $\theta$ of the chrominance vector C in the manner indicated in FIG. 4.

The gating circuit 104 forces the angle $\alpha°$, calculated by the element 86, to zero in response to the zero-value flag on the bus 72, whenever either I or Q value is zero. This arrangement avoids generation of erroneous phase angles any time the chrominance vector C coincides with either I or Q axes.

It will be noted that is not necessary to calculate the actual value of the angle $\alpha$ between 0° to 45° for the purposes of this invention. With appropriate modifications, the FIG. 2 circuit can generate the phase angle $\theta$ of the chrominance vector C from any value proportional to the actual value of the angle $\alpha$ —e.g., $\alpha' = M\alpha$, where M is a proportionality constant. However, for descriptive purposes only, the invention herein is often explained in conjunction with the value of the angle $\alpha$ in degrees.

Figure 5:
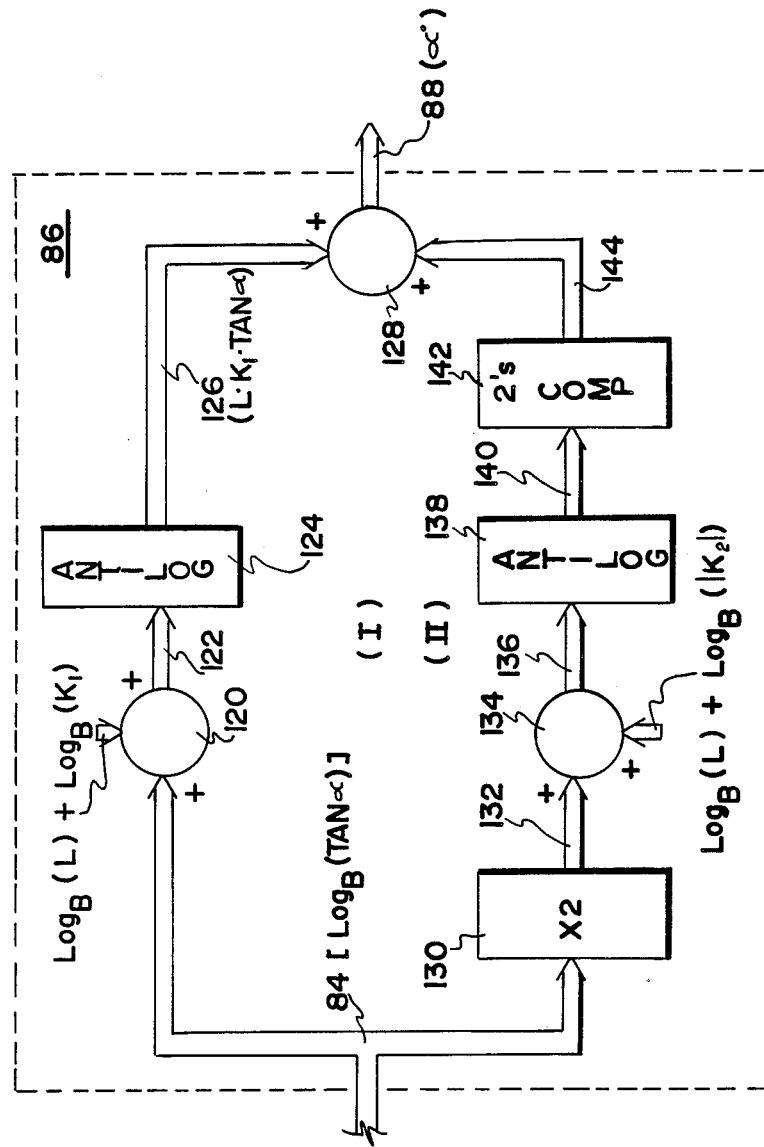
FIG. 5 shows a more-detailed block diagram of a circuit for calculating the angle $\alpha$, which varies over a range of 0° to 45°.

FIG. 5 depicts the circuitry incorporating the present invention, which may be substituted for the element 86 in FIG. 2. The FIG. 5 circuitry 86 generates an angle $\alpha$ between 0° and 45°, which is related to the phase angle $\theta°$ of the chrominance vector C in the manner indicated in FIG. 4.

The basic equation used to compute the angle $\alpha$ in radians is as follows:

$$\alpha = \text{Arctangent}\left(\frac{\text{Smaller of the }|I|\text{ and }|Q|\text{ values}}{\text{Larger of the }|I|\text{ and }|Q|\text{ values}}\right), \quad (2)$$

where $\alpha$ is the value of the angle $\alpha$ in radians
$= \text{Arctangent (tan }\alpha)$      (3)
$\simeq \Sigma K_l(\tan \alpha)^l$, where $l$ is an index varying from 0 to $n$      (4)
$= K_0 + K_1 (\tan \alpha) + K_2 (\tan \alpha)^2$, etc. for $\alpha$ varying within a given range of values (e.g., 0 to 0.85 radians)      (5)

A multiple regression model was fitted to this equation for $\alpha$ varying from 0 to 0.85 radians (about 45°). The values of the constants were found to be:
$K_0 = -0.0041$
$K_1 = 1.0768$
$K_2 = -0.2863$ Because $K_0$ is very small and because it is desirable to avoid large percentage errors near $\alpha = 0$, $K_0$ is set equal to zero. Thus, the new approximation becomes:

$$\alpha = K_1 (\tan \alpha) + K_2 (\tan \alpha)^2 \quad (6)$$

$$\alpha° = LK_1 (\tan \alpha) + LK_2 (\tan \alpha)^2, \text{ where } \alpha° \text{ is the} \quad (7)$$

angle $\alpha$ in degrees, and $L$ is a multiplier (equal to $180/\pi$ or 57.30) to transpose the angle $\alpha$ in radians to the angle in degrees The operation of the circuit element 86 can be better understood from the following development.

$$\alpha° = LK_1 (\tan \alpha) - L|K_2| (\tan \alpha)^2 \quad (8)$$

$= \text{Antilog}_B [\text{Log}_B(L) + \text{Log}_B(K_1) + \text{Log}_B(\tan \alpha)] -$      (9)

$\text{Antilog}_B [\text{Log}_B(L) + \text{Log}_B(|K_2|) + 2 \text{Log}_B (\tan \alpha)]$ $= \text{I-II}$, where the Roman numerals I and II      (10)

respectively represent the corresponding mathematical expressions in the equation 9

The circuit elements 86 estimates the angle $\alpha°$ from the associated value $\text{Log}_B(\tan \alpha)$ by using the equation 10. Basically, the FIG. 5 circuit 86 has two parts. The upper part calculates the value identified by the Roman numeral I in the expression given in the equation 10. The lower part, on the other hand, computes the value of the expression indicated by the Roman numeral II in the equation 10.

To this end, a summing circuit 120 adds a value equal to $\text{Log}_B(L) + \text{Log}_B(K_1)$ to the value $\text{Log}_B(\tan \alpha)$ on the bus 84. The output of the summing circuit 120 is fed via a bus 122 to an antilogarithm determining element 124, which may be a ROM (read-only-memory) that is programmed to produce on its output bus 126 values equal to the antilogarithms of the input values applied to the ROM as the respective address codes. The value present on the bus 126, corresponding to the expression indicated by the Roman numeral I in the equation 10, is fed to an adder 128.

To compute the expression designated by the Roman numeral II in the equation 10, the value of $\text{Log}_B(\tan \alpha)$ is multiplied by a factor of 2 in a multiplier 130 to generate on its output bus 132 a value equal to $2 \cdot \text{Log}_B(\tan \alpha)$. The 2's multiplier 130 may be a register, where the output bits are left shifted one bit as compared to the input.

A summing circuit 134 adds to the value on the bus 132, equal to $2 \cdot \text{Log}_B(\tan \alpha)$, a value equal to $\text{Log}_B(L) + \text{Log}_B(|K_2|)$. The output of the summing circuit 134 on the bus 136 is applied to an antilogarithm determining element 138, which may also be a ROM, to produce on its output bus 140 a value corresponding to the expression II in the equation 10.

The polarity of the value on the bus 140 is reversed by a 2's complement circuit 142, and the output thereof on the bus 144 is applied to the adder 128. The adder 128 combines the values on the buses 126 and 144, corresponding to the expressions designated respectively by the Roman numerals I and II, in accordance with the equation 10 to generate the value of the angle $\alpha$ in degrees on the bus 88.

The value of ° between 0° and 45° on the bus 88 is transformed in the manner indicated in FIG. 2 to produce the associated phase angle $\theta$ of the chrominance vector C.

For some applications, it is desirable instead to calculate the value of $\alpha$ in some arbitrary units, and not in degrees. For these applications, the basic equation 6 for $\alpha$ can be rearranged as follows:

$$\alpha' = M\alpha = MK_1(\tan \alpha) - M|K_2|(\tan \alpha)^2, \text{ where} \quad (11)$$

$M$ is an arbritrary multiplier (e.g., 128)

$$= \text{Antilog}_B[\text{Log}_B(M) + \text{Log}_B(K_1) + \text{Log}_B(\tan \alpha)] - \quad (12)$$

$$\text{Antilog}_B[\text{Log}_B(M) + \text{Log}_B(|K_2|) + 2\text{Log}_B(\tan \alpha)]$$

$$= \text{III-IV, where the Roman numerals III and} \quad (13)$$

IV respectively represent the corresponding mathematical expressions in the equation 12

From a comparison of the equations 9 and 12, it will be seen that the hardware for calculating the angle $\alpha$ in the arbitrary units will be similar to the FIG. 5 hardware for calculating the angle $\alpha$ in degrees. The only difference is that the term $\text{Log}_B(L)$ in the equation 9 is replaced by a term $\text{Log}_B(M)$ in the equation 12. In the interest of brevity, the operation of the circuitry for calculating the angle $\alpha$ in the arbitrary units will not be repeated.

The modified FIG. 5 circuit for generating the angle $\alpha$ in the arbitrary units can be embodied into the FIG. 2 circuit with appropriate changes, so that the angle values $\alpha'$ in the arbitrary units may be translated into the phase angle $\theta$ of the chrominance vector.

For other applications, it is not necessary to estimate the actual value of the angle $\alpha$ either in degrees or in the arbitrary units. For these applications, it is adequate if a proportional value $\alpha''$ equal to $N(\alpha/K_1)$ is generated instead, where N is an arbitrary constant (e.g., 256). To this end, the foregoing equation 6 is rearranged as follows:

$$\alpha'' = N(\alpha/K_1) = N\tan \alpha - N(|K_2|/K_1)(\tan \alpha)^2 \quad (14)$$

$$= \text{Antilog}_B[\text{Log}_B(N) + \text{Log}_B(\tan \alpha)] - \quad (15)$$

$$\text{Antilog}_B[\text{Log}_B(N) + \text{Log}_B(|K_2|) - \text{Log}_B(K_1) +$$

$$2 \cdot \text{Log}_B(\tan \alpha)]$$

$$= \text{V-VI, where the Roman numerals V and VI} \quad (16)$$

respectively represent the corresponding mathematical expressions in the equation 15

The equation 14 can also be rearranged in the following format:

$$\alpha'' = N(\alpha/K_1) = \text{Antilog}_B[\text{Log}_B(N) + \text{Log}_B(\tan \alpha)] - \quad (17)$$

$$N(|K_2|/K_1) \text{Antilog}_B[2 \cdot \text{Log}_B(\tan \alpha)]$$

$$= \text{VII-VIII, where the Roman numerals VII} \quad (18)$$

and VIII respectively represent the corresponding mathematical expressions in the equation 17

FIGS. 6 and 7, respectively, depict the circuitry for implementing the equations 16 and 18. In the FIG. 6 circuit, the top and the bottom parts respectively calculate the values given by the mathematical expressions V and VI in the equation 16. On the other hand, the upper and the lower parts in the FIG. 7 circuit respectively compute the values corresponding to the mathematical expressions indicated by the Roman numerals VII and VIII in the equation 18.

In the FIG. 6 circuit, the value $\text{Log}_B(\tan \alpha)$ on the bus 84 is fed to the first input of an adder 150. The adder 150 adds a value equal to $\text{Log}_B(N)$ to its first input, and the output thereof is applied to an antilog determining element 152, which produces on the output bus 154 thereof a value equal to $N\tan \alpha$. The antilog determining element 152 may be a ROM. The value of $N\tan \alpha$ on the bus 154 is channeled to a subtracter 156.

In the lower part of the FIG. 6 circuit, the value of $\text{Log}_B(\tan \alpha)$ on the bus 150 is multiplied by a factor of 2 in a multiplier 158 to generate on the output bus 160 thereof a value equal $2 \cdot \text{Log}_B(\tan \alpha)$. A summing circuit 162 adds to the value on the bus 160 a value equal to $\text{Log}_B(N) + \text{Log}_B(|K_2|) - \text{Log}_B(K_1)$. The output of the summing circuit on the bus 164 is applied to another antilog determining element 166. The subtracter 156 combines the output of the antilog determining element 166 on the bus 168 with the value of $N\tan \alpha$ on the bus 154 to produce on its output port a proportional value $\alpha'' = N(\alpha/K_1)$ in accordance with the equation 16.

In the FIG. 7 circuit, an adder 180 and an antilog determining element 182 perform the same functions as the adder 150 and the antilog determining element 152 in FIG. 6. The output, $N\tan \alpha$, of the antilog determining element 182 on the bus 184 is routed to a subtracter 186.

In the lower half of the FIG. 7 circuit, a multiplier 188 multiplies the value of $\text{Log}_B(\tan \alpha)$ on the input bus by a factor 2 to generate a value equal to $2 \cdot \text{Log}_B(\tan \alpha)$ on its output bus 190. The element 192 determines the antilogarithm of the respective input values. The output of the element 192 is multiplied by a factor equal to N $(|K_2|/K_1)$ in element 196, and the output thereof on the bus 198 is fed to the subtracter 186. The subtracter 186 combines the respective inputs to generate a value $\alpha'$ equal to N $(\alpha/K_1)$ in accordance with the equation 18.

To simplify the construction of the multiplier 196 in the FIG. 7 circuitry, the factor N $(|K_2|/K_1)$ can be replaced by a value which is equal to the nearest integer power of two. Then a simple shift register type circuit may be substituted for the multiplier 196. This could provide a good approximation for certain applications.

The circuitry of FIGS. 6 and 7 may be incorporated into the FIG. 2 circuit with appropriate modifications, so that the proportional value $\alpha'' = N(\alpha/K_1)$ can be transposed into the phase angle $\theta$ of the chrominance vector.

The subject invention provides a satisfactory approximation for the calculation of the phase angle $\theta$ of the vector sum C of a pair of orthogonal signals at lower hardware costs compared to other techniques mentioned above.

What is claimed is:

1. Apparatus for generating the instantaneous phase value $\theta$ of the vector sum C of a pair of quadrature-related signal components I and Q with respect to one of said signal components I; said apparatus comprising:
   (a) means for receiving a pair of instantaneous magnitude values of said orthogonal signal components I and Q;
   (b) means for calculatiang a value equal to:

$$\tan \alpha = \frac{\text{Smaller of said magnitude values}}{\text{Larger of said magnitude values}}$$

(c) a source of coefficient values $K\iota$, where $\iota$ is an index varying from 1 to 2;

(d) means for calculating the logarithm of $\tan \alpha$ to the base B, hereinafter $\text{Log}_B(\tan \alpha)$; wherein said logarithm calculating means comprises a ROM to which the value of $\tan \alpha$ is applied as an address code, and which is programmed to contain the associated $\text{Log}_B(\tan \alpha)$ values at the respective memory locations;

(e) first means for adding to the value of $\text{Log}_B(\tan \alpha)$ a value equal to $\text{Log}_B(M) + \text{Log}_B(K_1)$, where M is a constant;

(f) first means for determining the antilogarithm of the output of said first adding means;

(g) means for multiplying the value of $\text{Log}_B(\tan \alpha)$ by a factor of 2;

(h) second means for adding to the output of said multiplying means a value equal to $\text{Log}_B(M) + \text{Log}_B(|K_2|)$ to the base B;

(i) second means for determining the antilogarithm of the output of said second adding means;

(j) means for combining the output of said first antilogarithm determining means with the output of said second antilogarithm determining means to generate the value $\alpha'$; and (k) means for transposing the angle $\alpha'$ to the corresponding phase angle $\theta$ of the vector sum C.

2. Apparatus for generating the isntantaneous phase value $\theta$ of the vector sum C of a pair of quadature-related signal components I and Q with respect to one of said signal components I; said apparatus comprising:

(a) means for receiving a pair of instantaneous magnitude values of said orthogonal signal components I and Q;

(b) means for calculating a value equal to:

$$\tan \alpha = \frac{\text{Smaller of said magnitude values}}{\text{Larger of said magnitude values}}$$

(c) a source of coefficient values $K\iota$, where $\iota$ is an index varying from 1 to 2;

(d) means for calculating the logarithm of $\tan \alpha$ to the base B, hereinafter $\text{Log}_B(\tan \alpha)$;

(e) first means for adding to the value of $\text{Log}_B(\tan \alpha)$ a value equal to $\text{Log}_B(M) + \text{Log}_B(K_1)$, where M is a constant;

(f) first means for determining the antilogarithm of the output of said first adding means;

(g) means for multiplying the value of $\text{Log}_B(\tan \alpha)$ by a factor of 2;

(h) second means for adding to the output of said multiplying means a value equal to $\text{Log}_B(M) + \text{Log}_B(|K_2|)$ to the base B;

(i) second means for determining the antilogarithm of the output of said second adding means;

(j) means for combining the output of said first antilogarithm determining means with the output of said second antilogarithm determining means to generate the value $\alpha'$: and (k) means for transposing the angle $\alpha'$ to the corresponding phase angle $\theta$ of the vector sum C;

wherein said first and second antilogarithm determining means comprise a ROM which is programmed to contain the antilogarithm values to the base B at the memory locations corresponding to the respective address codes.

3. Apparatus for generating the instantaneous phase value $\theta$ of the vector sum C of a pair of quadrature-related signal components I and Q with respect to one of said signal components I; said apparatus comprising:

(a) means for receiving a pair of instantaneous magnitude values of said orthogonal signal components I and Q;

(b) means for calculating a value equal to:

$$\tan \alpha = \frac{\text{Smaller of said magnitude values}}{\text{Larger of said magnitude values}}$$

(c) a source of coefficient values $K\iota$, where $\iota$ is an index varying from 1 to 2;

(d) means for calculating the logarithm of $\tan \alpha$ to the base B, herein after $\text{Log}_B(\tan \alpha)$;

(e) first means for adding to the value of $\text{Log}_B(\tan \alpha)$ a value equal to $\text{Log}_B(M) + \text{Log}_B(K_1)$, where M is a constant;

(f) first means for determining the antilogarithm of the output of said first adding means;

(g) means for multiplying the value of $\text{Log}_B(\tan \alpha)$ by a factor of 2;

(h) second means for adding to the output of said multiplying means a value equal to $\text{Log}_B(M) + \text{Log}_B(|K_2|)$ to the base B;

(i) second means for determining the antilogarithm of the output of said second adding means;

(j) means for generating the 2's complement of the output of said second antilogarithm determining means;

(k) further, means for additively combining the output of said 2's complement generating means with the output of said first antilogarithm determining means to generate said angle $\alpha'$; and (1) means for transposing the angle $\alpha'$ to the corresponding phase angle $\theta$ of the vector sum C.

4. The apparatus as defined in claim 3 wherein said 2's complement generating means comprises:

(a) means for inverting the respective bits of the output of said second antilogarithm determining means; and (b) further means for additively combining a +1 to the least significant bit position of the output of said inverting means to generate said 2's complement.

* * * * *

UNITED STATES PATENT AND TRADEMARK OFFICE
CERTIFICATE OF CORRECTION

PATENT NO. : 4,710,892

DATED : December 1, 1987

INVENTOR(S) : Russell T. Fling

It is certified that error appears in the above-identified patent and that said Letters Patent is hereby corrected as shown below:

Column 1, line 48, that portion reading "tan a)1" should read -- tan a)$^1$ --; Column 5, line 6, that portion reading "27°" should read -- 270° --.

Signed and Sealed this

Eleventh Day of October, 1988

*Attest:*

DONALD J. QUIGG

*Attesting Officer*  *Commissioner of Patents and Trademarks*